United States Patent
Kim et al.

(12) 
(10) Patent No.: US 6,197,693 B1
(45) Date of Patent: Mar. 6, 2001

(54) METHODS FOR FORMING GATE ELECTRODES OF SEMICONDUCTOR DEVICES

(75) Inventors: Hyeon Soo Kim; Sang Do Lee, both of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/328,437

(22) Filed: Jun. 9, 1999

(30) Foreign Application Priority Data

Jun. 29, 1998 (KR) .................................................. 98-24728

(51) Int. Cl.⁷ .................................................. H01L 21/00
(52) U.S. Cl. .......................... 438/692; 438/719; 438/740; 438/742
(58) Field of Search ...................................... 438/692, 693, 438/696, 706, 710, 719, 720, 723, 724, 740, 742, 743, 744, 745, 756; 216/38, 67, 79, 75

(56) References Cited

U.S. PATENT DOCUMENTS 5,807,786    9/1998   Chang .
5,837,577   11/1998   Cherng .
5,994,231 * 11/1999   Sonego et al. ................... 438/723 X

FOREIGN PATENT DOCUMENTS 10-214809    8/1998   (JP) .

* cited by examiner

Primary Examiner—William Powell
(74) Attorney, Agent, or Firm—Jacobson, Price, Holman & Stern, PLLC

(57) ABSTRACT

Generally, after etching process for gate electrode patterning, oxidation process is performed to compensate for etching damage. There is provided a method for forming a gate electrode of a semiconductor device, which prevents the metal layer comprised of the gate electrode for being oxidized in such an oxidation process. In the present invention, a polysilicon layer is etched to form a gate electrode pattern and re-oxidation process is performed to compensate for the etching damage. After this, an inter-layer insulating layer is formed over the entire structure and partially removed so as to expose the polysilicon layer. A part of the polysilicon layer is then selectively removed to form an opening in the inter-layer insulating layer. Here, the other part of the polysilicon layer, which will be connected to a metal layer later, is exposed through the opening. The metal layer is then buried within the opening to complete the formation of the gate electrode made of poly-metal structure.

20 Claims, 2 Drawing Sheets

"METHODS FOR FORMING GATE
ELECTRODES OF SEMICONDUCTOR
DEVICES

FIELD OF THE INVENTION

The present invention relates to methods for forming semiconductor devices; and, more particularly, to methods for forming gate electrodes of semiconductor devices. The invention can prevent the layer of metal comprised of a gate electrode from being oxidized in the re-oxidation process which is performed to compensate for etching damage.

DESCRIPTION OF THE PRIOR ART

FIG. 1 shows the processes for forming a gate electrode of a semiconductor device according to the prior art. Referring to the drawing, On a silicon substrate are, in turn, formed a gate oxide layer 11, a layer of polysilicon 12, a layer of diffusion barrier 13 and a layer of tungsten 14. All of the layers are selectively etched to form a pattern of gate electrode as shown in the drawing.

In the etching process to form the gate electrode pattern as described in the above, damage is generated. In order to compensate for the damage, re-oxidation process is performed with thermal oxidation manner. However, there was a drawback in the art that oxidation was also generated in the exposed tungsten layer on the gate electrode, during the re-oxidation process.

In order to solve the problem described as above, research and development has been proceeding for the purpose of developing the technology in which the silicon substrate is selectively oxidized without oxidation of the layer of metal such as tungsten. However, the technology is not practically introduced into the manufacturing processes of semiconductor devices yet.

SUMMARY OF THE INVENTION

It is, therefore, an object of the present invention to provide a method for forming gate electrodes of semiconductor devices which prevents the layer of metal constructed for the gate electrode from being oxidized in the re-oxidation process which compensates for the damage generated in the etching process for forming the pattern of gate electrode.

In accordance with an embodiment of the present invention, there is provided a method for forming gate electrodes of semiconductor devices which comprises the steps of: forming, in turn, a layer of polysilicon, a etching stopping layer and a sacrificed layer over a semiconductor substrate; selectively etching the sacrificed layer, the etching stopping layer and the polysilicon layer to form a pattern of gate electrode; performing a thermal oxidation process in order to compensate for etching damage generated; forming an inter-layer insulating layer over the entire structure after completion of the thermal oxidation and partially removing the interlayer insulating layer until the sacrificed layer is exposed; removing the sacrificed layer and the etching stopping layer to form an opening through which the polysilicon layer is exposed; forming a layer of metal over the entire structure after forming the opening; and selectively removing the metal layer to remain the metal layer only within the opening, thereby, forming the gate electrode made of the polysilicon layer and the metal layer.

According to the method of the present, the pattern of gate electrode is formed by etching. Re-oxidation is then performed to compensate for the etching damage. An interlayer insulating layer is then formed over the entire structure and an opening is formed in the insulating layer. Here, the opening is formed so as to expose the part of polysilicon layer connected with a metal layer that will be formed later. After this, the metal layer is buried within the opening to complete the formation of the gate electrode made of poly-metal structure.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

The invention will be illustrated in detail by the following preferred embodiment with reference to the accompanying drawings.

FIGS. 2a to 2d are sectional views showing the processes for forming a gate electrode of a semiconductor device according to one embodiment of the present invention.

Figure 1:
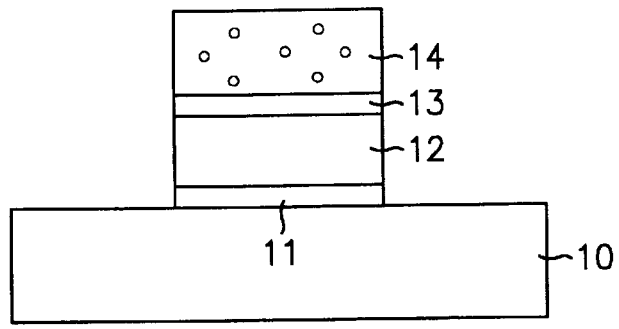
FIG. 1 is a sectional view showing the processes for forming a gate electrode of a semiconductor device according to the prior art.
Figure 2A:
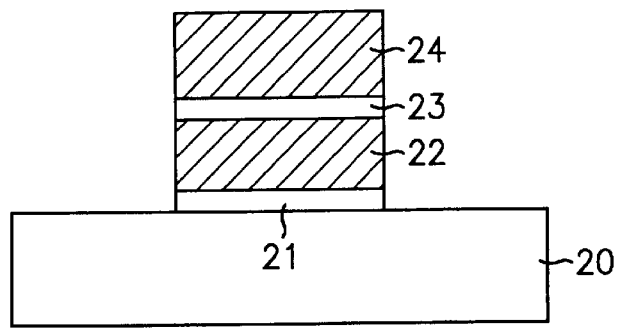
FIGS. 2a to 2d are sectional views showing the processes for forming a gate electrode of a semiconductor device according to one embodiment of the present invention.

Referring to FIG. 2a, after a gate oxide layer 21 is formed on a silicon substrate 20, a first polysilicon layer 22, a sacrificed oxide layer 23 and a second polysilicon layer 24 are, in turn, formed and are selectively etched in reverse order to form a gate electrode pattern. Here, instead of the sacrificed oxide layer 23 (which corresponds to the etching stopping layer), a layer of the material such as silicon nitride (SiN) having largely different etching selection rate for polysilicon may be formed. That is to say, the sacrificed oxide layer 23 plays roles of an etching stopping layer and a sacrificed layer, and the second polysilicon layer 24 does a role of a sacrificed layer. Also, instead of the first polysilicon layer 22 (which corresponds to the sacrificed layer), a layer of the material having largely different etching selection rate for the etching stopping layer may be formed.

Figure 2B:
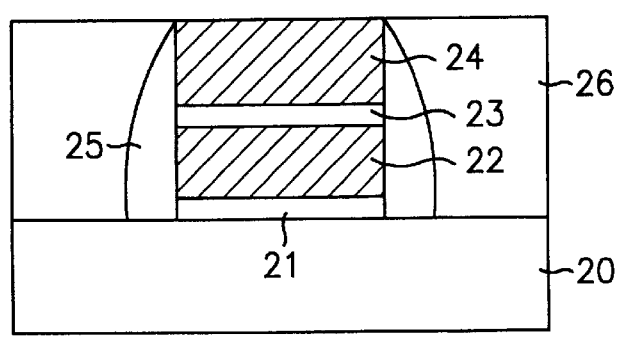

Referring to FIG. 2b, in order to compensate for etching damage generated from the etching process for forming the gate electrode pattern, re-oxidation is performed with thermal oxidation method. After this, an oxide spacer 25 is formed on the sidewalls of the second polysilicon layer 24, the sacrificed oxide layer 23 and the first polysilicon layer 22. An inter-layer insulating layer 26 is then formed over the entire structure and partially removed by chemical mechanical polishing method or dry etching method to expose the second polysilicon layer 24. After or before forming the oxide spacer 25, ion injection process may be performed to form source/drain region (not shown). The re-oxidation process may be also performed after forming the oxide spacer 25.

Figure 2C:
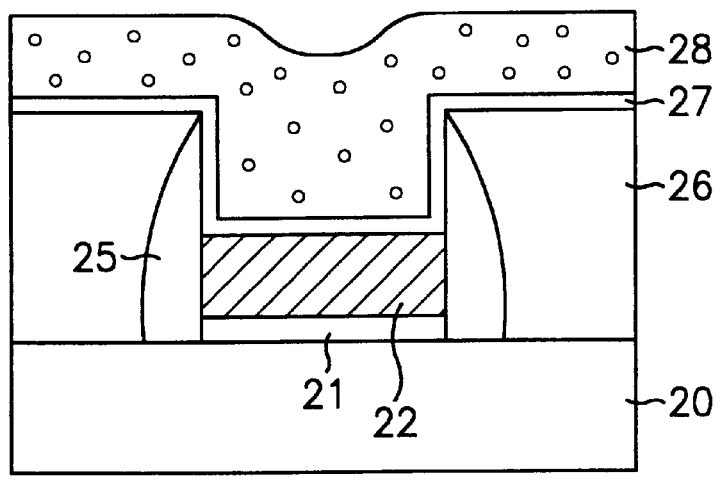

Referring to FIG. 2c, the second polysilicon layer 24 and the sacrificed oxide layer 23 is etched to form an opening so as to expose the first polysilicon layer 22. After this, a diffusion barrier layer 27 and a metal layer 28 are formed over the entire structure. Here, the diffusion barrier layer 27 may be formed with WN, TiN, TaN and the like. The metal layer 28 may be also formed with W, Al, Cu and the like. The sacrificed oxide layer 23 plays a role of an etching stopping layer during etching the second polysilicon layer 24. The first polysilicon layer 22 is not largely damaged during the etching process of the sacrificed oxide layer 23 because of different etching characteristic of polysilicon to oxide.

Figure 2D:
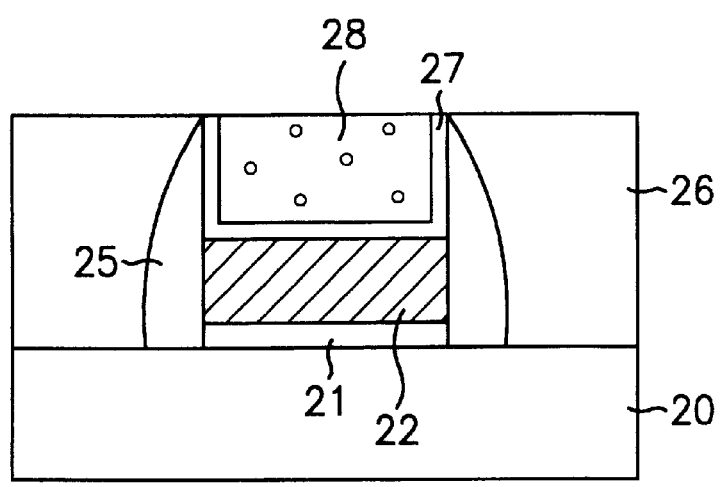

Referring to FIG. 2d, the metal layer 28 and the diffusion barrier layer 27 are partially removed by chemical mechanical polishing method or dry etching method to leave them only within the opening.

In another embodiment of the present invention, only a sacrificed layer may be used in the place of the sacrificed layer and the etching stopping layer of the previous embodiment. Wherein the sacrificed layer of this embodiment should be formed from material having largely different etching selection rate for polysilicon.

In another embodiment of the present invention, after a gate electrode pattern is formed with a polysilicon layer, an inter-layer insulating layer is formed over the entire structure and partially removed by chemical mechanical polishing method or dry etching method until the polysilicon layer is exposed. A part of the polysilicon layer is then selectively removed to form an opening. Here, the other part of the polysilicon layer, which will be connected to a metal layer later, is exposed through the opening. After forming the opening, a diffusion barrier layer and the metal layer are formed over the entire structure and polished or partially etched to leave them only within the opening and thus to complete the formation of the gate electrode made of poly-metal structure.

While the present invention has been described with respect to certain preferred embodiments only, other modifications and variations may be made without departing from the spirit and scope of the present invention as set forth in the following claims.

What is claimed is:

1. A method for forming a gate electrode of a semiconductor device comprising the steps of:

forming, in turn, a layer of polysilicon, an etching stopping layer and a sacrificed layer over a semiconductor substrate (first step);

selectively etching the sacrificed layer, the etching stopping layer and the polysilicon layer to form a pattern of the gate electrode (second step);

performing a thermal oxidation process in order to compensate for etching damage generated (third step);

forming an inter-layer insulating layer over the entire structure after completion of the thermal oxidation and partially removing the interlayer insulating layer until the sacrificed layer is exposed (fourth step);

removing the sacrificed layer and the etching stopping layer to form an opening through which the polysilicon layer is exposed (fifth step);

forming a layer of metal over the entire structure after forming the opening (sixth step); and selectively removing the metal layer to remain the metal layer only in the opening, thereby, forming the gate electrode made of the polysilicon layer and the metal layer (seventh step).

2. The method for forming a gate electrode of a semiconductor device according to claim 1, wherein the metal layer is formed from at least one of W, Al and Cu.

3. The method for forming a gate electrode of a semiconductor device according to claim 2, wherein the fifth step further comprises the steps of: forming a diffusion barrier layer made of WN, TiN or TaN over the entire structure after completion of the fifth step; and forming the metal layer on the diffusion barrier layer, and the seventh step comprises the step of selectively removing the diffusion barrier layer and the metal layer to leave the layers only within the opening.

4. The method for forming a gate electrode of a semiconductor device according to claim 1, wherein the etching stopping layer is formed with material having largely different etching selection rate for the polysilicon layer, and the sacrificed layer is formed from material having largely different etching selection rate for the etching stopping layer.

5. The method for forming a gate electrode of a semiconductor device according to claim 4, wherein the sacrificed layer is formed with polysilicon, and the etching stopping layer is formed with oxide or silicon nitride.

6. The method for forming a gate electrode of a semiconductor device according to claim 2, wherein the etching stopping layer is formed with material having largely different etching selection rate for the polysilicon layer, and the sacrificed layer is formed from material having largely different etching selection rate for the etching stopping layer.

7. The method for forming a gate electrode of a semiconductor device according to claim 6, wherein the sacrificed layer is formed with polysilicon, and the etching stopping layer is formed with oxide or silicon nitride.

8. The method for forming a gate electrode of a semiconductor device according to claim 3, wherein the etching stopping layer is formed with material having largely different etching selection rate for the polysilicon layer, and the sacrificed layer is formed from material having largely different etching selection rate for the etching stopping layer.

9. The method for forming a gate electrode of a semiconductor device according to claim 8, wherein the sacrificed layer is formed with polysilicon, and the etching stopping layer is formed with oxide or silicon nitride.

10. The method for forming a gate electrode of a semiconductor device according to claim 1, wherein the method further comprises the step of forming an insulating spacer on the side-wall of the gate electrode (eighth step) after the second step.

11. A method for forming a gate electrode of a semiconductor device comprising the steps of:

forming, in turn, a layer of polysilicon and a sacrificed layer over a semiconductor substrate (first step);

selectively etching the sacrificed layer and the polysilicon layer to form a pattern of the gate electrode (second step);

performing a thermal oxidation process in order to compensate for etching damage generated (third step);

forming an inter-layer insulating layer over the entire structure after completion of the thermal oxidation and partially removing the interlayer insulating layer until the sacrificed layer is exposed (fourth step);

removing the sacrificed layer to form an opening through which the polysilicon layer is exposed (fifth step);

forming a layer of metal over the entire structure after forming the opening (sixth step); and selectively removing the metal layer to remain the metal layer only in the opening, thereby, forming the gate electrode made of the polysilicon layer and the metal layer (seventh step).

12. The method for forming a gate electrode of a semiconductor device according to claim 11, wherein the metal layer is formed from at least one of W, Al and Cu.

13. The method for forming a gate electrode of a semiconductor device according to claim 12, wherein the fifth step further comprises the steps of: forming a diffusion barrier layer made of WN, TiN or TaN over the entire structure after completion of the fifth step; and forming the metal layer on the diffusion barrier layer, and the seventh step comprises the step of selectively removing the diffusion barrier layer and the metal layer to leave the layers only within the opening.

14. The method for forming a gate electrode of a semiconductor device according to claim 11, wherein the sacrificed layer is formed with material having largely different etching selection rate for the polysilicon layer.

15. The method for forming a gate electrode of a semiconductor device according to claim 14, wherein the sacrificed layer is formed with silicon nitride.

16. The method for forming a gate electrode of a semiconductor device according to claim 12, wherein the sacrificed layer is formed with material having largely different etching selection rate for the etching stopping layer.

17. The method for forming a gate electrode of a semiconductor device according to claim 16, wherein the sacrificed layer is formed with silicon nitride.

18. The method for forming a gate electrode of a semiconductor device according to claim 13, wherein the sacrificed layer is formed with material having largely different etching selection rate for the etching stopping layer.

19. The method for forming a gate electrode of a semiconductor device according to claim 18, wherein the sacrificed layer is formed with silicon nitride.

20. The method for forming a gate electrode of a semiconductor device according to claim 11, wherein the method further comprises the step of forming an insulating spacer on the side-wall of the gate electrode (eighth step) after the second step.

* * * * *